(12) United States Patent
Chen et al.

(10) Patent No.: US 11,974,413 B2
(45) Date of Patent: Apr. 30, 2024

(54) SYSTEMS AND METHODS FOR HEAT DISSIPATION IN COMPUTING SYSTEMS WITH ENVIRONMENT RESISTANCE

(71) Applicant: Quanta Computer Inc., Taoyuan (TW)

(72) Inventors: Yi-Chieh Chen, Taoyuan (TW); Yueh-Chang Wu, Taoyuan (TW); Ching-Yi Shih, Taoyuan (TW); Kang Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/730,913

(22) Filed: Apr. 27, 2022

(65) Prior Publication Data
US 2023/0354556 A1 Nov. 2, 2023

(51) Int. Cl.
*H05K 7/20* (2006.01)
*G06F 1/20* (2006.01)
*H05K 5/06* (2006.01)

(52) U.S. Cl.
CPC ......... *H05K 7/20409* (2013.01); *G06F 1/206* (2013.01); *H05K 5/06* (2013.01)

(58) Field of Classification Search
CPC ....... H05K 7/20409; H05K 5/06; G06F 1/206
See application file for complete search history.

(56) References Cited

U.S. PATENT DOCUMENTS

| | | | | |
|---|---|---|---|---|
| 4,656,559 A | * | 4/1987 | Fathi | H05K 7/1461 361/721 |
| 5,305,184 A | * | 4/1994 | Andresen | H05K 7/20872 361/720 |
| 6,374,912 B1 | * | 4/2002 | LaGrotta | H05K 7/20409 174/559 |
| 6,547,001 B2 | * | 4/2003 | McCullough | B21D 53/02 174/16.3 |
| 6,864,573 B2 | * | 3/2005 | Robertson | H05K 7/20409 361/801 |
| 9,432,561 B2 | * | 8/2016 | Samuels | G03B 17/56 |
| 9,474,148 B2 | * | 10/2016 | Liberty | H05K 1/0271 |
| 9,860,987 B2 | * | 1/2018 | Singh | H05K 1/111 |
| 9,910,342 B2 | * | 3/2018 | Samuels | G03B 17/56 |
| 10,271,456 B2 | * | 4/2019 | Tufty | H05K 7/20236 |
| 10,541,229 B2 | * | 1/2020 | Vadhavkar | H01L 25/0657 |
| 10,908,651 B2 | * | 2/2021 | Honma | G06F 1/1656 |
| 10,912,224 B2 | * | 2/2021 | Flowers | H05K 7/20154 |
| 10,921,869 B2 | * | 2/2021 | Carbone | G06F 1/203 |
| 11,032,939 B2 | * | 6/2021 | Tufty | H05K 7/20772 |
| 2006/0060328 A1 | * | 3/2006 | Ewes | H01L 23/4338 165/185 |
| 2007/0025087 A1 | * | 2/2007 | Chen | H05K 7/209 361/704 |
| 2010/0097767 A1 | * | 4/2010 | Jude | H05K 5/061 361/709 |

(Continued)

*Primary Examiner* — Abhishek M Rathod
(74) *Attorney, Agent, or Firm* — NIXON PEABODY LLP

(57) ABSTRACT

A computing system including a water-resistant chassis, at least one electronic component with a heat sink, and a gap filler. The heat sink includes an arrangement of fins separated by inter-fin spaces. The gap filler is in contact with both the heat sink and the water-resistant chassis. The gap filler is positioned in the inter-fin spaces to provide a heat conduction path between the heat sink and the chassis.

17 Claims, 5 Drawing Sheets

(56) References Cited

U.S. PATENT DOCUMENTS

| | | | |
|---|---|---|---|
| 2010/0097769 A1* | 4/2010 | Lin | G06F 1/20 |
| | | | 361/720 |
| 2011/0149518 A1* | 6/2011 | Salamon | H05K 7/20454 |
| | | | 361/704 |
| 2014/0124174 A1* | 5/2014 | Campbell | H05K 7/20809 |
| | | | 29/890.035 |
| 2015/0049243 A1* | 2/2015 | Samuels | G03B 17/55 |
| | | | 348/374 |
| 2015/0257249 A1* | 9/2015 | Kim | H01L 23/4275 |
| | | | 361/708 |
| 2016/0334692 A1* | 11/2016 | Samuels | G03B 17/55 |
| 2017/0188481 A1* | 6/2017 | Kim | H01L 23/3675 |
| 2019/0008071 A1* | 1/2019 | Kim | H05K 1/0206 |
| 2019/0104644 A1* | 4/2019 | Shoji | H04B 7/26 |
| 2020/0093028 A1* | 3/2020 | Kim | H01L 23/3675 |
| 2020/0146176 A1* | 5/2020 | Meth | C08K 5/56 |
| 2022/0225541 A1* | 7/2022 | Chen | G06F 1/20 |
| 2022/0346273 A1* | 10/2022 | Chen | G06F 1/182 |
| 2023/0164367 A1* | 5/2023 | Mahoney | H04N 21/226 |
| | | | 361/679.01 |

\* cited by examiner

SYSTEMS AND METHODS FOR HEAT DISSIPATION IN COMPUTING SYSTEMS WITH ENVIRONMENT RESISTANCE

FIELD OF THE INVENTION

The present invention relates generally to systems and methods for optimizing thermal performance in computing systems, and more specifically, to dissipating heat from components within water resistant and/or dust resistant computing systems.

BACKGROUND OF THE INVENTION

Computing systems (e.g., desktop computers, blade servers, rack-mount servers, etc.) are employed in large numbers in various applications. High demand applications, such as network based systems, datacenters, or high density finite element simulations can cause excess heat to be generated by the hardware of the computing systems. For example, a hard-drive of a server, memory modules installed in the server, and processors of the server, etc., operating at high capacity can generate excess heat. Heat generated by computing systems is generally dissipated to avoid damage or performance degradation of such components in the computing systems. For example, excessive heat can melt interconnects of fragile electronics or can damage substrates of these electronics.

Excessive heat can also reduce a rated lifetime of a hardware component of a computing system. For example, memory modules frequently store charge on capacitors and refresh these capacitors at time intervals. Excessive heat can reduce the amount of charge that these capacitors can store and can further increase the leakage rate of these capacitors, thereby shortening the time intervals for a refresh. Memory modules are ubiquitous in computing systems, and as such, thermal management for effective dissipation of heat around memory modules is important. In addition, excessive heat may cause processors to reduce speed or even shut down, thereby impeding computer system operation. Thus, the present disclosure is directed at addressing problems associated with thermal management in computing systems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a water-resistant chassis, at least one electronic component with a heat sink, and a gap filler material. The heat sink includes an arrangement of fins separated by inter-fin spaces. The gap filler material is in contact with both the heat sink and the chassis. The gap filler material is positioned in the inter-fin spaces to provide a heat conduction path between the heat sink and the chassis.

In an implementation, the computing system further includes an enclosed cabinet in which the chassis is located. The electronic component is in the form of an electronic card. In an implementation, the chassis includes a corrugated surface interfacing the gap filler. In an implementation, protrusions of the corrugated surface are repeated at a higher frequency compared to the arrangement of fins on the heat sink. In an implementation, the gap filler material provides a flat surface for the heat sink to interface with the chassis. In an implementation, the electronic component is a processor. In an implementation, the gap filler material includes thermal grease. In an implementation, the chassis includes a top portion and a bottom portion, both of the top and bottom portions having one or more fins, and both the top and bottom portions secured to each other with fasteners. In an implementation, the chassis further includes a handle.

According to certain aspects of the present disclosure, a method for thermal management in a water-resistant chassis containing at least one electronic component includes applying a gap filler material on at least one heat sink of the at least one electronic component. The method further includes contacting the gap filler material to an interior surface of the chassis to provide a heat conduction path from the at least one electronic component to the chassis.

In an implementation, the chassis includes one or more fins. In an implementation, the chassis includes a corrugated surface interfacing the gap filler material. In an implementation, protrusions of the corrugated surface are repeated at a higher frequency compared to arrangement of fins on the heat sink. In an implementation, the electronic component is a processor. In an implementation, the gap filler material includes thermal grease.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
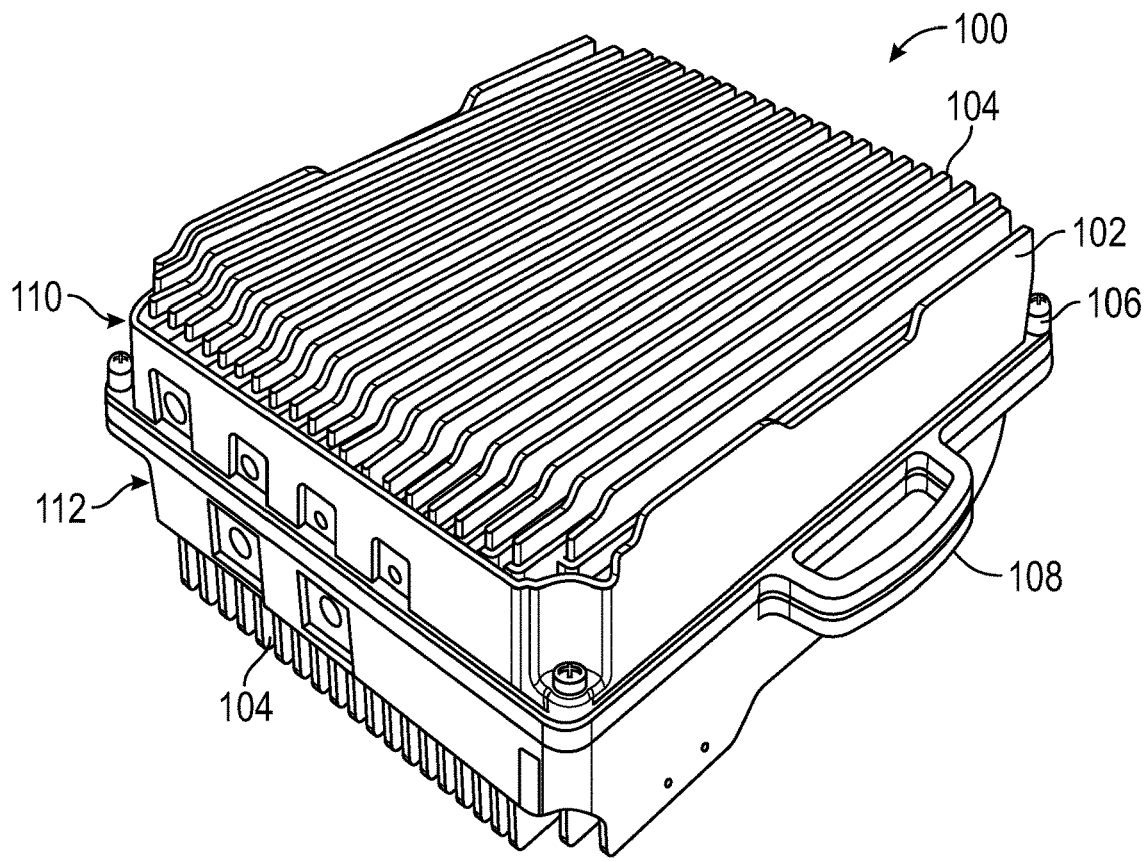
FIG. 1A is computing system, according to certain aspects of the present disclosure.

High-speed computing central processing units (CPUs) and/or graphics processing units (GPUs) are installed in computing systems (e.g., servers, switches, high-density storage, etc.) to facilitate handling workloads with increased network traffic and high-dimensional computing at reasonable speeds. Even mid-level CPUs or low-power CPUs can generate heat that needs to be managed. Computing systems typically have chassis or housings that protect components like processors, memory, motherboards, power supplies, and other electronic components. The chassis typically have openings for facilitating heat escape and for drawing in cooler air for cooling components within the chassis. In some environments, using chassis with openings is not a viable option. For example, computing systems used for power management or in telecommunication switch facilities may have to be installed outside and exposed to environmental conditions. These computing systems may need to be water resistant, dust resistant, insect resistant, etc. As such, having openings in the chassis is infeasible. Without holes in the chassis, fans are ineffective in moving heat outside of the chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5%" of a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

When a chassis is required to be dust and water resistant, heat dissipation of components inside the chassis is difficult. This is especially difficult with an outsourcing card having a localized thermal solution (e.g., heat sinks). With an enclosed chassis (i.e., a chassis having no openings), add-in cards and/or components dissipate heat using some sort of heat sink physically coupled to the card and/or components. Without openings in the chassis, the extracted heat from the heat sink mostly remains in the enclosed chassis because the heat sink cannot exchange heat efficiently for the heat to escape the chassis. Embodiments of the present disclosure provide systems and methods for realizing a conductive heat path for efficient heat dissipation from within an enclosed chassis. The chassis and the localized thermal solution are included in the heat path, and heat conduction instead of convection is relied upon for efficient heat exchange. Embodiments of the present disclosure also provide a low cost solution for heat management.

Referring to FIG. 1A, a computing system 100 is provided according to some implementations. The computing system 100 includes an enclosed chassis 102. The enclosed chassis 102 includes one or more fins 104. In some implementations, the chassis 102 includes a top portion 110 and a bottom portion 112. The top portion 110 and the bottom portion 112 can be joined together using one or more fasteners 106 (e.g., screws, glues, nuts and bolts, etc.). The one or more fins 104 can be provided on the top portion 110 of the chassis 102 and/or the bottom portion 112 of the chassis 102. In some implementations, the chassis 102 includes a handle 108 for ease of transport. In some implementations, the chassis 102 is an enclosed cabinet.

Figure 1B:
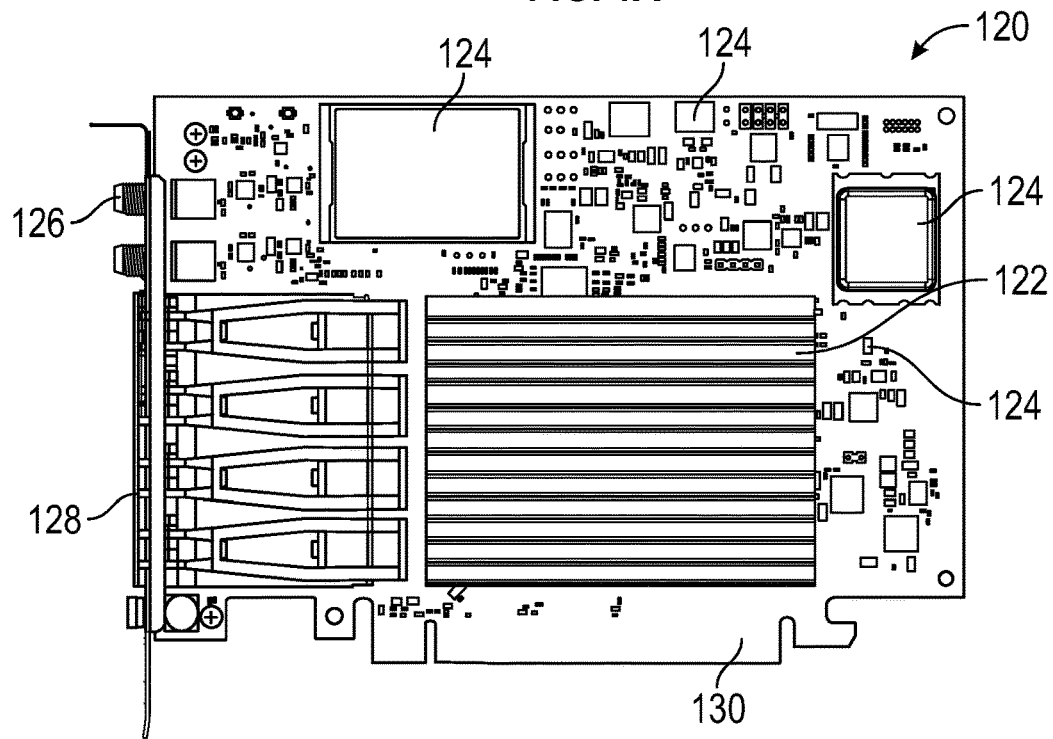
FIG. 1B is an electronic card, according to certain aspects of the present disclosure.

Referring to FIG. 1B, an electronic card 120 is provided. The electronic card 120 can be provided in the computing system 100. The electronic card 120 can be a motherboard, a graphics card, a network interface card, etc. The electronic card 120 includes a printed circuit board (PCB) 130. The PCB 130 can include one or more processors or controllers. The one or more processors or controllers can be provided under a heat sink 122. The heat sink 122 can include one or more fins with inter-fin spaces. The PCB 130 can include one or more electronic components 124. These electronic components 124 may include memories, registers, controllers, resistors, capacitors, operational amplifiers, comparators, counters, etc. The PCB 130 can further include connections to analog ports 126 and/or digital ports 128.

Typically, when installing the electronic card 120 in the chassis 102 (FIG. 1A), to resolve any thermal issues, the heat sink 122 that came with the one or more processors is removed and replaced with another heat sink or high conductivity material. That is, processor manufacturers typically provide processors with stock heat sinks, and those stock heat sinks may arrive already bonded to the processors. The stock heat sinks are typically replaced with another heat sink or high conductivity material to improve thermal conductivity. There are some disadvantages to replacing the stock heat sinks. The process of removing the stock heat sinks can result in damaging the processors or the electronic card itself. In some cases, removing the stock heat sinks can void the warranty on the processors.

Figure 2A:
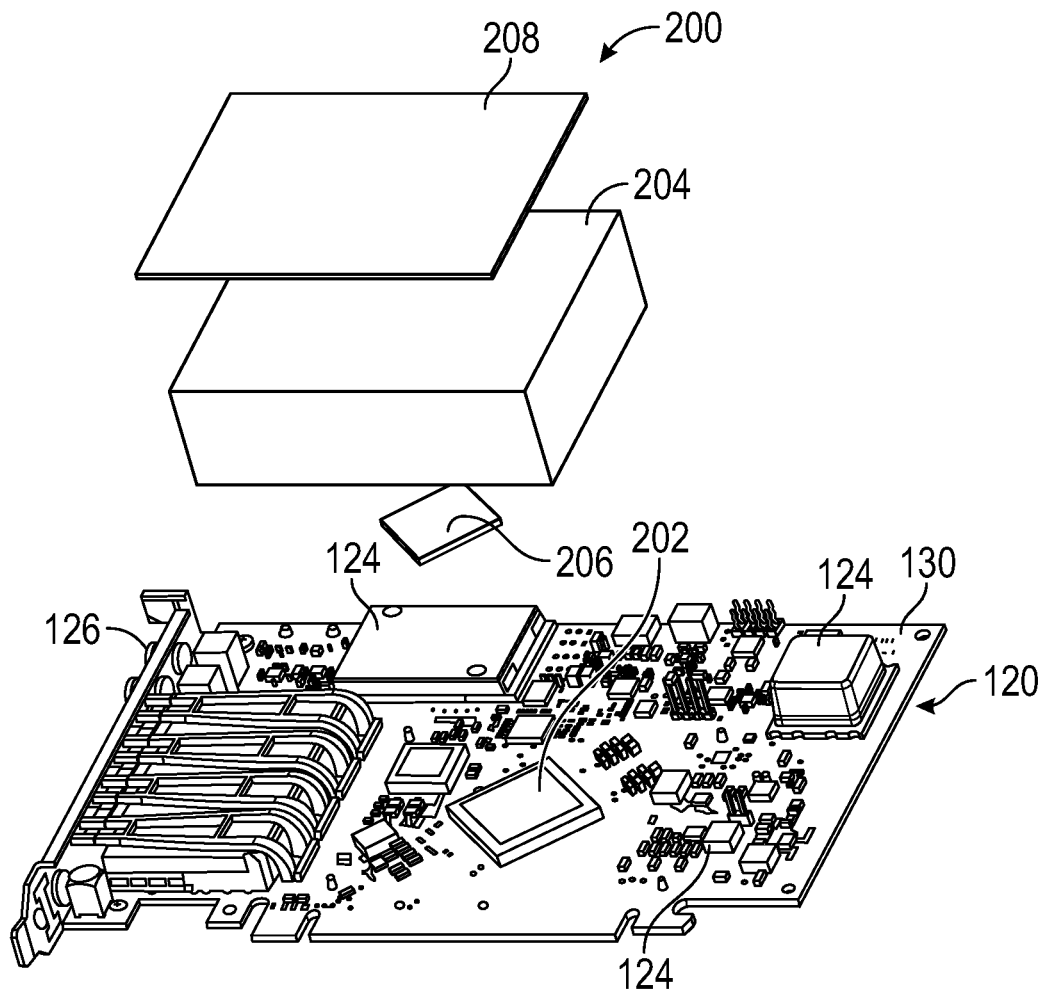
FIG. 2A is an exploded perspective view of a modified card in the prior art.
Figure 2B:
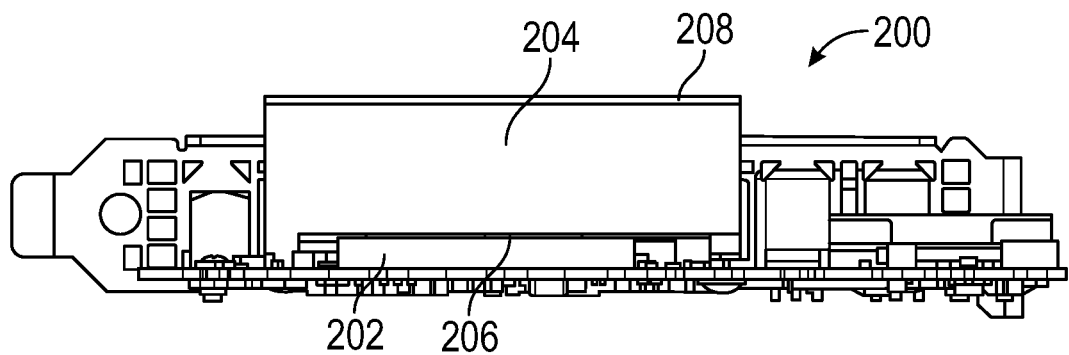
FIG. 2B is a front view of the modified card of FIG. 2A.

Referring to FIG. 2A, an exploded perspective view of a modified card 200 in the prior art. The modified card 200 includes a second heat sink 204 installed on the electronic card 120. In FIG. 2A, the heat sink 122 (FIG. 1B) is removed from a processor 202, and the second heat sink 204 is coupled to the processor 202 via a first pad 206. The first pad 206 bonds the second heat sink 204 to the processor 202 to facilitate heat transfer from the processor 202 to the second heat sink 204. A second pad 208 is provided above the second heat sink 204 for bonding the second heat sink 204 to the chassis of the computing system (e.g., the chassis 102). There are cost disadvantages with the modified card 200. For example, the modified card requires obtaining the second heat sink 204, the first pad 206, and the second pad 208, along with labor costs associated with properly bonding these components together. FIG. 2B illustrates a front view of the modified card 200. In addition to the cost disadvantages, since the second pad 208 should directly contact the chassis 102 (FIG. 1A), the height of the second heat sink 204 as well as the height of the second pad 208 should be properly measured to ensure contact. This provides less design flexibility with respect to the shape of the second heat sink 204. As depicted in FIG. 2A, the second heat sink 204 has a flat surface and is depicted as a rectangular prism.

Figure 3A:
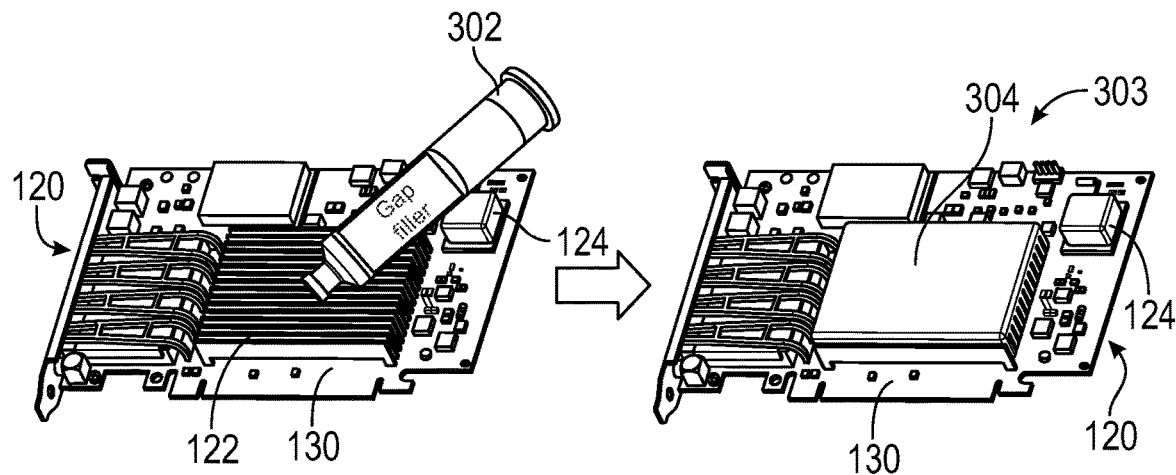
FIG. 3A illustrates a process for providing a heat conduction path, according to certain aspects of the present disclosure.
Figure 3B:
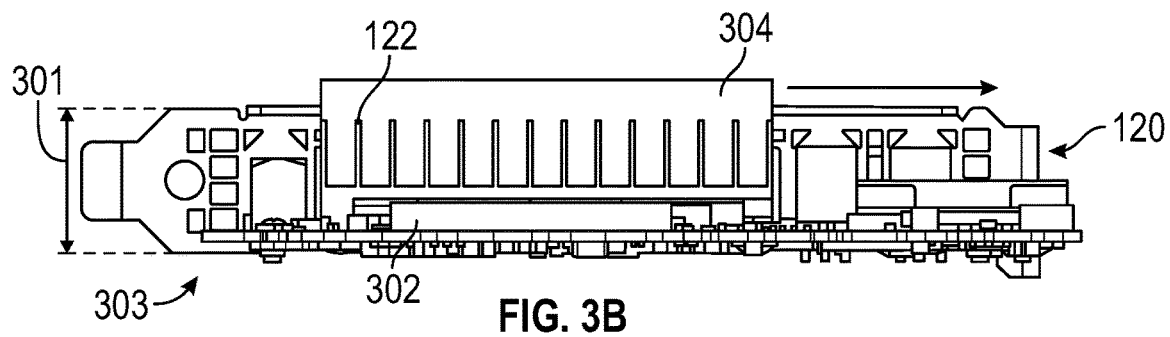
FIG. 3B illustrates a front view of a gap filled card, according to certain aspects of the present disclosure.
Figure 3C:
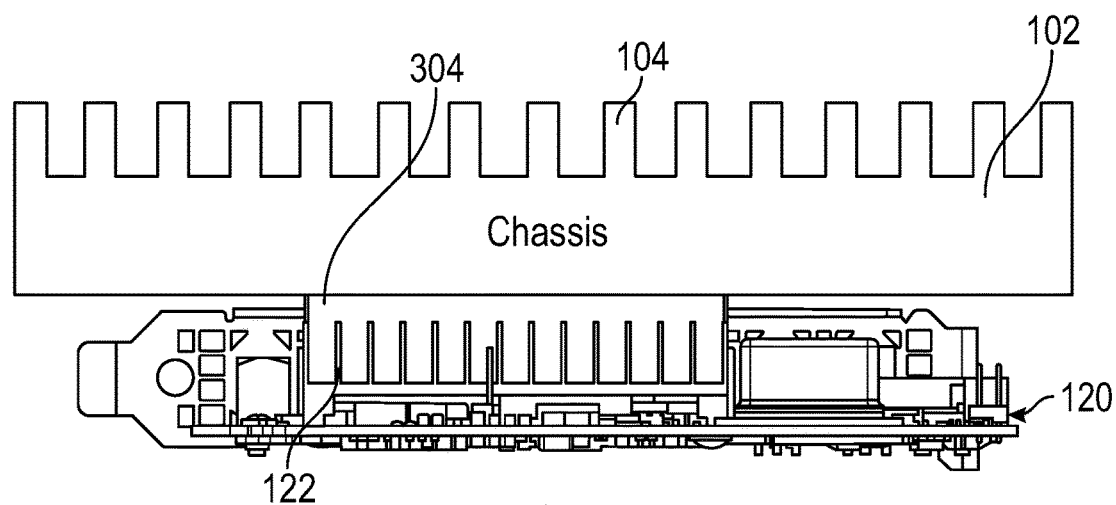
FIG. 3C illustrates the gap filled card of FIG. 3B interfacing with a chassis, according to certain aspects of the present disclosure.

Referring to FIG. 3A, a process for providing a heat conduction path is provided, according to some implementations of the present disclosure. A gap filler applicator 302 is used to fill spaces in the heat sink 122 of the electronic card 120. A gap filler material 304 is the resultant. Beyond filling the spaces, the gap filler material 304 covers the heat sink 122, as shown in a gap filled card 303. FIG. 3B illustrates a front view of the gap filled card 303. As shown in the gap filled card 303, the gap filler material 304 extends beyond a height 301 of the electronic card 120. Referring to FIG. 3C, the gap filler material 304 is extended to a height that allows the gap filler material 304 to contact the chassis 102. The gap filler material 304 can be a thermal grease or liquid thermal interface material that allows heat conduction heat transfer from the heat sink 122 to the chassis 102. Examples of the gap filler material 304 include Laird Tflex CR350 and Tflex CR607 and Honeywell HLT3500 and HLT 7000. The gap filler material 304 can have a malleable creamy texture at first application and can solidify over time, yet still maintaining a level of softness. Advantages of the process in FIG. 3A include the ability to use the original heat sink (e.g., the heat sink 122) of the processor and no need to remove the original heat sink. Furthermore, the only material needed is the gap filler material 304, which is a malleable material that can form contact with the chassis 102, regardless of the shape of the chassis 102.

TABLE 1

Cost differential between FIG. 2B and FIG. 3B

| Item | Prior Art (FIG. 2B) | | | FIG. 3B |
| --- | --- | --- | --- | --- |
| | first pad 206 | second pad 208 | second heat sink 204 | gap filler material 304 |
| Price ratio | 2 | 1 | 15 | 7 |
| Total price ratio | 18 | | | 7 |

The cost differential between FIG. 2B and FIG. 3B is provided in Table 1. Using the cost of the second pad 208 (FIG. 2B) as a frame of reference, the first pad 206 (FIG. 2B) is twice as costly, the second heat sink 204 (FIG. 2B) is fifteen times as costly, and the gap filler material 304 is seven times as costly. The total price for the solution in FIG. 2B is 18, while the total price for the solution in FIG. 3B is 7. The solution in FIG. 3B can more than reduce the cost by half while removing any likelihood of voiding warranties or destroying processors, both of which can increase the cost substantially.

In some implementations, there is a temperature margin between the thermal performance of the solutions of FIG. 2B and FIG. 3B. For example, using a processor that consumes about 40 W in an ambient temperature of 50° C. with airflow of about 40 cubic feet per minute (CFM). The temperature margin between the FIG. 2B and FIG. 3B was about 5° C. with FIG. 2B having a temperature of about 80° C., and FIG. 3B having a temperature of about 85° C. This temperature margin can be reduced with further modifications.

Figure 4A:
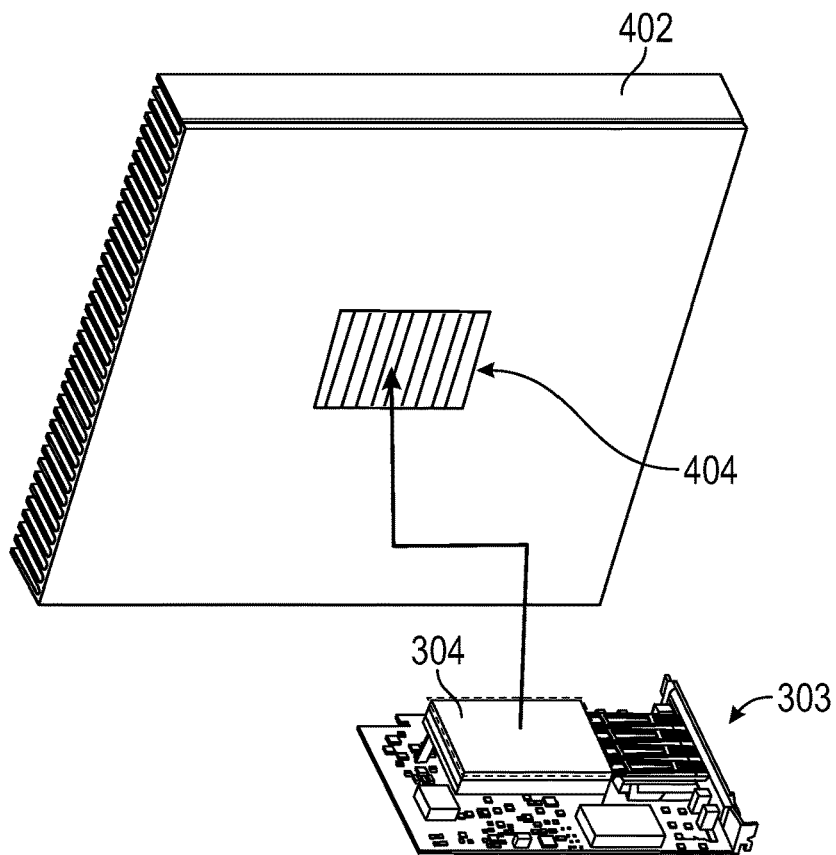
FIG. 4A illustrates a perspective view of the gap filled card of FIG. 3B matching a corrugated chassis surface, according to certain aspects of the present disclosure.
Figure 4B:
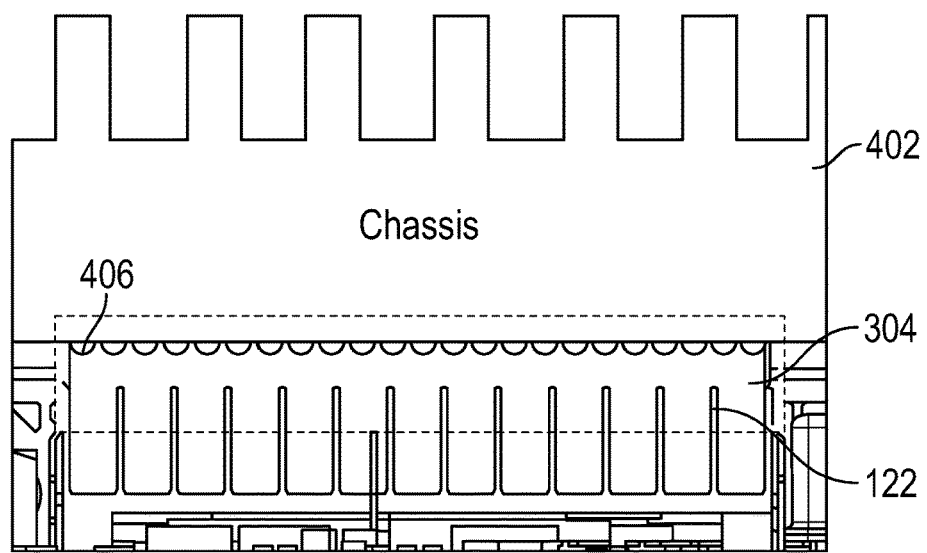
FIG. 4B illustrates a cross sectional view of the corrugated surface of FIG. 4A.

FIG. 4A is a perspective view showing the gap filled card 303 of FIG. 3B matched to a second chassis 402. The second chassis 402 can include a corrugated surface 404. FIG. 4B illustrates a cross sectional view of the corrugated surface showing multiple protrusions 406 that interface with the gap filler material 304. The multiple protrusions 406 can have a frequency that is higher than the frequency of both the fins of the heat sink 122 and the one or more fins of the second chassis 402.

Using Fourier's law of heat conduction (equation 1), heat flux q is directly proportional to material conductivity k, surface area A, and temperature gradient ΔT. The heat flux q is indirectly proportional to the thickness of the material ΔX.

$$q = -kA\frac{\Delta T}{\Delta X} \quad \text{Equation 1}$$

Turning to equation 1, the heat flux q for the second chassis 402 is higher compared to the chassis 102 when temperature gradient ΔT is held constant. The surface area A is increased by the corrugated surface 404. Similarly, increasing the surface area A decreases temperature gradient ΔT for a constant heat flux q. Thus, if the processor under the heat sink 122 generates the same amount of heat that needs to be dissipated, the increase in surface area should decrease the temperature gradient ΔT. In some implementations, the temperature margin for FIG. 4B compared to FIG. 2B is about 3° C., that is, FIG. 2B provides an 80° C. temperature while FIG. 4B provides 83° C.

Figure 5:
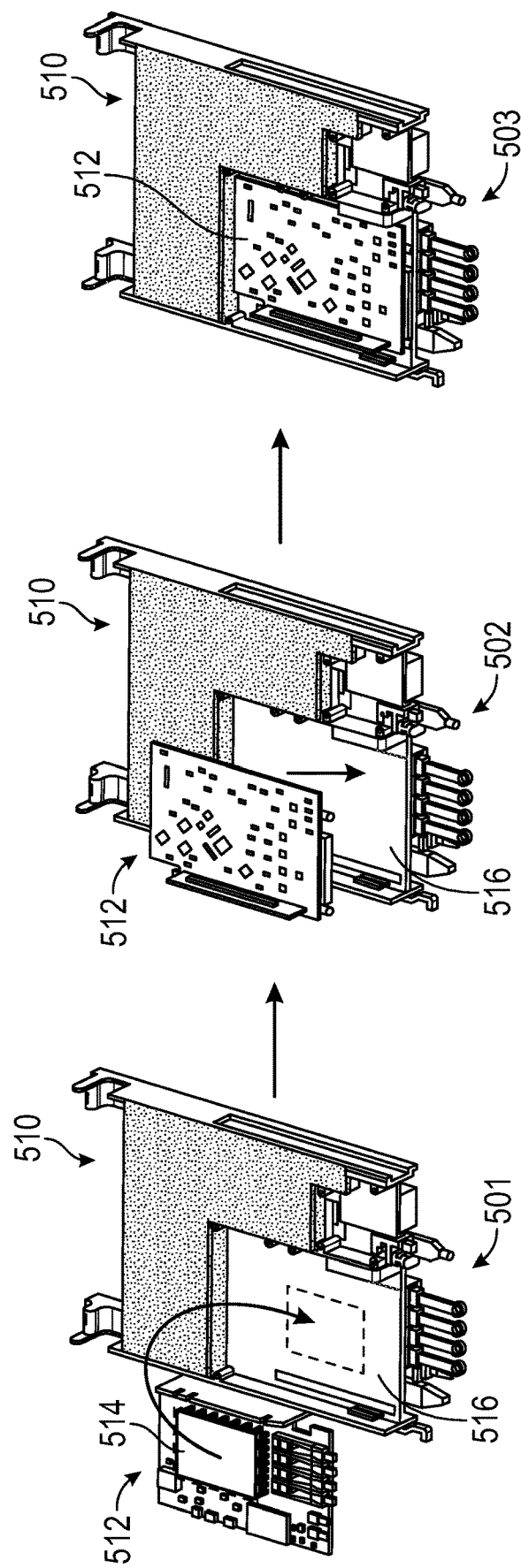
FIG. 5 illustrates a process for installing an electronic card in a computing device, according to certain aspects of the present disclosure.

FIG. 5 provides a summary of installing an electronic card 512 in a computing device 510. At step 501, the electronic card 512 includes a gap filler material 514 that can be contacted with a metal surface 516 for heat conduction. The gap filler material 514 is matched to a portion of the metal surface 516. At step 502, the electronic card 512 is flipped over and placed in the computing device 510. At step 503, the electronic card 512 is secured within the computing device 510.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
a water-resistant chassis;
at least one electronic component with a heat sink, the heat sink including an arrangement of fins separated by inter-fin spaces; and
a gap filler material in contact with both the heat sink and the chassis, the gap filler material being positioned in the inter-fin spaces and completely filling the entirety of the inter-fin spaces such that only the gap filler material is present in the inter-fin spaces, the gap filler material providing a direct heat conduction path between the heat sink and the chassis;
wherein the chassis includes a corrugated surface interfacing the gap filler material.

2. The computing system of claim 1, wherein the electronic component is in the form of an electronic card.

3. The computing system of claim 1, wherein protrusions of the corrugated surface are repeated at a higher frequency compared to the arrangement of fins on the heat sink.

4. The computing system of claim 3, wherein heat flows directly from the arrangement of fins on the heat sink via the gap filler material to the corrugated surface of the chassis.

5. The computing system of claim 3, wherein the protrusions of the corrugated surface are shorter than height of the fins of the heat sink.

6. The computing system of claim 1, wherein the gap filler material provides a flat surface for the heat sink to interface with the chassis.

7. The computing system of claim 6, wherein the flat surface is a single flat surface such that all interfaces between the chassis and the gap filler material are on the single flat surface.

8. The computing system of claim 1, wherein the electronic component is a processor.

9. The computing system of claim 1, wherein the gap filler material includes thermal grease.

10. The computing system of claim 1, wherein the chassis includes a top portion and a bottom portion, both of the top and bottom portions having one or more fins of the arrangement of fins, and both the top and bottom portions secured to each other with fasteners.

11. The computing system of claim 10, wherein the chassis further includes a handle.

12. The computing system of claim 10, wherein the chassis includes a corrugated surface interfacing the gap filler material, the protrusions of the corrugated surface being repeated at a higher frequency compared to the arrangement of fins on the heat sink and the arrangement of fins of the top portion of the chassis.

13. The computing system of claim 12, wherein heat flows from the arrangement of fins on the heat sink via the gap filler material to the corrugated surface of the chassis.

14. The computing system of claim 12, wherein the protrusions of the corrugated surface are shorter than height of the fins of the heat sink.

15. The computing system of claim 1, wherein thickness of the gap material varies across the surface of the heat sink such that thickness of the gap material in the inter-fin spaces is larger than thickness of the gap material at positions of the fins.

16. A computing system comprising:
a water-resistant chassis, the water-resistant chassis including a top portion and a bottom portion joined together with a fastener,
an outer surface of the top portion having a first arrangement of fins,
an inner surface of the top portion having a flat surface, and
an outer surface of the bottom portion having a second arrangement of fins;
at least one electronic component bonded to a heat sink, the heat sink including a third arrangement of fins separated by inter-fin spaces, the at least one electronic component provided within the water-resistant chassis; and
a gap filler material in contact with both the heat sink and the inner surface of the top portion of the water-resistant chassis, the gap filler material being positioned in the inter-fin spaces to provide a direct heat conduction path between the heat sink and the chassis; and
wherein the water-resistant chassis includes a corrugated surface interfacing the gap filler material.

17. The computing system of claim 16, wherein the water-resistant chassis further includes a handle.

* * * * *